United States Patent
Then et al.

(10) Patent No.: US 10,665,707 B2
(45) Date of Patent: May 26, 2020

(54) TECHNIQUES FOR CO-INTEGRATING TRANSITION METAL DICHALCOGENIDE (TMDC)-BASED AND III-N SEMICONDUCTOR-BASED TRANSISTOR DEVICES

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 5 days.

(21) Appl. No.: 15/771,752

(22) PCT Filed: Dec. 2, 2015

(86) PCT No.: PCT/US2015/063341
§ 371 (c)(1),
(2) Date: Apr. 27, 2018

(87) PCT Pub. No.: WO2017/095400
PCT Pub. Date: Jun. 8, 2017

(65) Prior Publication Data
US 2018/0308965 A1    Oct. 25, 2018

(51) Int. Cl.
*H01L 29/778* (2006.01)
*H01L 29/267* (2006.01)
(Continued)

(52) U.S. Cl.
CPC ...... *H01L 29/7781* (2013.01); *H01L 21/8258* (2013.01); *H01L 27/092* (2013.01);
(Continued)

(58) Field of Classification Search
CPC ......... H01L 21/02485; H01L 21/02474; H01L 21/02477; H01L 21/02557; H01L 21/0256;
(Continued)

(56) References Cited

U.S. PATENT DOCUMENTS

| | | |
|---|---|---|
| 2012/0267684 A1 | 10/2012 | Tamari et al. |
| 2014/0183453 A1 | 7/2014 | Kim et al. |

(Continued)

FOREIGN PATENT DOCUMENTS

WO    2017/095400 A1    6/2017

OTHER PUBLICATIONS

International Search Report and Written Opinion received for PCT application No. PCT/US2015/063341. dated Jul. 29, 2016. 10 pages.
(Continued)

*Primary Examiner* — Tucker J Wright
*Assistant Examiner* — Scott Stowe
(74) *Attorney, Agent, or Firm* — Finch & Maloney PLLC

(57) ABSTRACT

Techniques are disclosed for co-integrating transition metal dichalcogenide (TMDC)-based p-channel transistor devices and III-N semiconductor-based n-channel transistor devices. In accordance with some embodiments, a p-channel transistor device configured as described herein may include a layer of TMDC material such as, for example, tungsten diselenide, tungsten disulfide, molybdenum diselenide, or molybdenum disulfide, and an n-channel transistor device configured as described herein may include a layer of III-V material such as, for example, gallium nitride, aluminum nitride, aluminum gallium nitride, and indium aluminum nitride. Transistor structures provided as described herein may be utilized, for instance, in power delivery applications where III-N semiconductor-based n-channel power transis-
(Continued)

tor devices can benefit from being integrated with low-leakage, high-performance p-channel devices providing logic and control circuitry. In some cases, a TMDC-based transistor provided as described herein may exhibit p-channel mobility in excess of bulk Si and thus may exhibit faster performance than traditional Si-based p-channel transistors.

20 Claims, 3 Drawing Sheets

(51) Int. Cl.
  *H01L 29/20* (2006.01)
  *H01L 29/24* (2006.01)
  *H01L 21/8258* (2006.01)
  *H01L 27/092* (2006.01)
(52) U.S. Cl.
  CPC .......... *H01L 29/2003* (2013.01); *H01L 29/24* (2013.01); *H01L 29/267* (2013.01); *H01L 29/7786* (2013.01)
(58) Field of Classification Search
  CPC ........... H01L 21/02568; H01L 29/7781; H01L 29/2003; H01L 29/24; H01L 29/267; H01L 29/7786
  See application file for complete search history.

(56) References Cited

U.S. PATENT DOCUMENTS

| | | |
|---|---|---|
| 2014/0197459 A1 | 7/2014 | Kis et al. |
| 2015/0041820 A1 | 2/2015 | Renaud |
| 2015/0123168 A1 | 5/2015 | Green et al. |
| 2016/0013277 A1* | 1/2016 | Ho .......................... H01L 29/24 257/29 |

OTHER PUBLICATIONS

International Preliminay Report on Patentability received for PCT application No. PCT/US2015/063341. dated Jun. 5, 2018. 6 pages.
Johnson, Dexter, "Tungsten Diselenide Is New 2-D Optoelectronic Wonder Material," Retrieved from the Internet at: https://spectrum.ieee.org/nanoclast/semiconductors/optoelectronics/tungsten-diselinide-is-new-2d-optoelectronic-wonder-material. Oct. 7, 2015. 2 pages.
Pradhan, et al., "Hall and field-effect mobilities in few layered p-WSe2 field-effect transistors," Scientific Reports, 5 : 8979 DOI: 10.1038/srep08979. Published: Mar. 11, 2015. pp. 1-8.
"Transition metal dichalcogenide monolayers," Retrieved from the Internet at: https://en.wikipedia.org/wiki/Transition_metal_dichalcogenide_monolayers?oldid=681895670. Oct. 9, 2015. 6 pages.
Wang, et al., "Electronics and optoelectronics of two-dimensional transition metal dichalcogenides," Nature Nanotechnology, Published Online: Nov. 6, 2012. DOI: 10.1038/NNANO.2012.193. pp. 699-711.

* cited by examiner

TECHNIQUES FOR CO-INTEGRATING TRANSITION METAL DICHALCOGENIDE (TMDC)-BASED AND III-N SEMICONDUCTOR-BASED TRANSISTOR DEVICES

BACKGROUND

Metal dichalcogenides are of the general chemical formula $MX_2$, where M represents a metal, and X represents a chalcogen, such as sulfur (S), selenium (Se), or tellurium (Te). In a typical metal dichalcogenide, each layer of metal atoms M is sandwiched between two layers of chalcogen atoms X.

Figure 1:
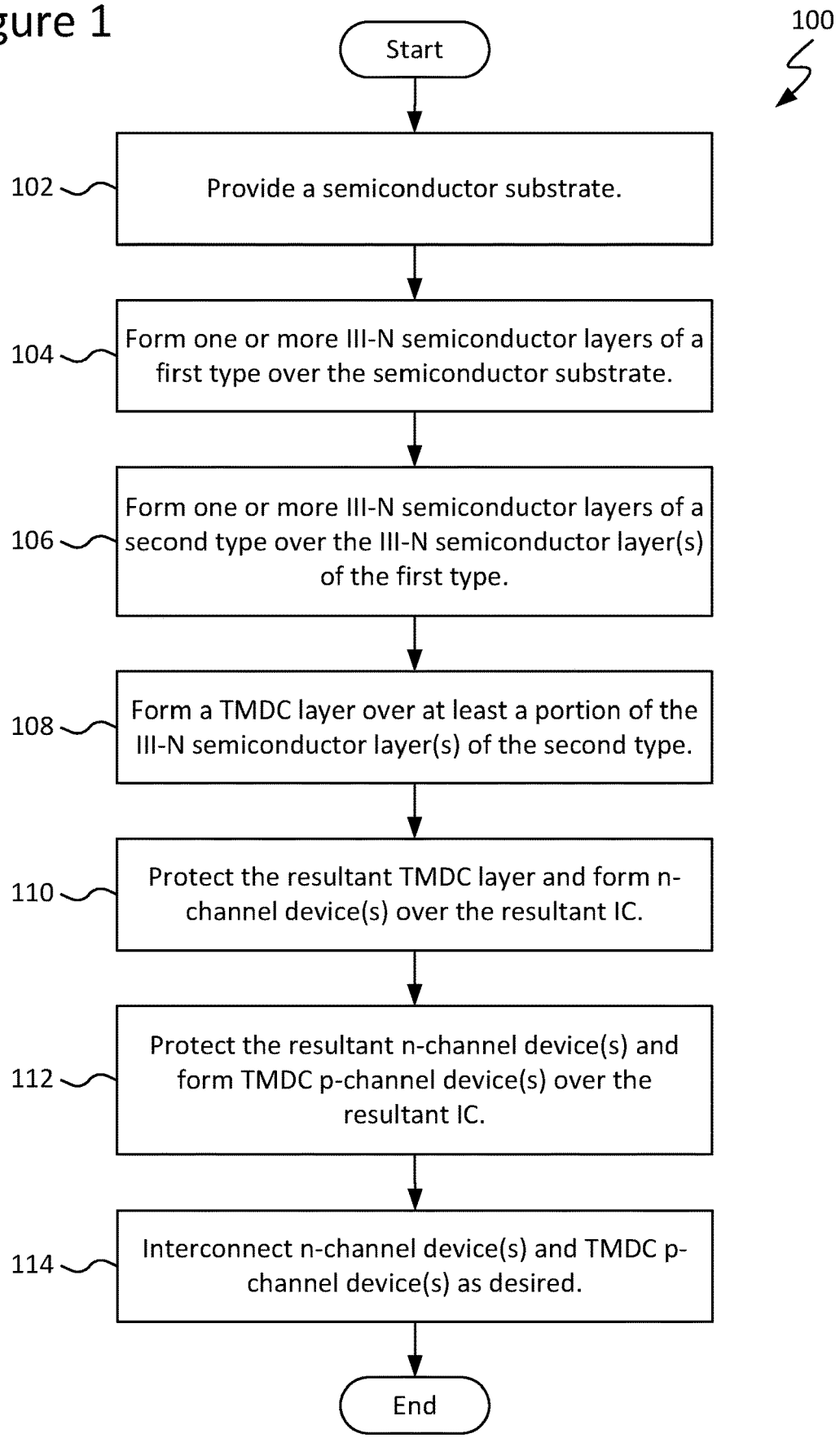
FIG. 1 is a flow diagram of a process of fabricating an integrated circuit (IC), in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for co-integrating transition metal dichalcogenide (TMDC)-based p-channel transistor devices and III-N semiconductor-based n-channel transistor devices. In accordance with some embodiments, a p-channel transistor device configured as described herein may include a layer of TMDC material such as, for example, tungsten diselenide ($WSe_2$), tungsten disulfide ($WS_2$), molybdenum diselenide ($MoSe_2$), or molybdenum disulfide ($MoS_2$), and an n-channel transistor device configured as described herein may include a layer of III-V material such as, for example, gallium nitride (GaN), aluminum nitride (AlN), aluminum gallium nitride (AlGaN), and indium aluminum nitride (InAlN). Although numerous applications will be apparent in light of this disclosure, monolithic circuitry co-integrated with TMDC p-channel and III-V n-channel devices as provided herein is particularly useful in applications where the TMDC p-channel devices provide high-speed performance suitable for logic and the III-V n-channel devices provide high mobility and large bandgap suitable for power delivery. To this end, some example applications include power management integrated circuits (PMICs), radio frequency (RF) power amplifiers, voltage regulator (VR) power trains, and other applications where gallium nitride (GaN)-based (or other III-N or III-V semiconductor-based) n-channel transistor devices can benefit from integrated low-leakage, high-performance p-channel devices providing logic and control circuitry. In some cases, a TMDC-based transistor provided as described herein may exhibit p-channel mobility in excess of bulk Si and thus may exhibit faster performance than traditional Si-based p-channel transistors. Numerous configurations and variations will be apparent in light of this disclosure.

General Overview

Power management integrated circuits (PMICs) and other power delivery applications typically utilize logic and controller circuits that may benefit from the use of high-performance, low-leakage p-channel devices. Although gallium nitride (GaN) has very high bandgap and simultaneously high mobility thereby making n-channel GaN devices suitable for power delivery applications, power delivery and radio frequency (RF) communications applications further require logic circuitry and controller circuits that tend to work best when implemented with high-performance, low-leakage p-channel devices. However, p-channel GaN devices are not particularly adequate in this regard.

Thus, and in accordance with some embodiments of the present disclosure, techniques are disclosed for co-integrating transition metal dichalcogenide (TMDC)-based p-channel transistor devices and III-N semiconductor-based n-channel transistor devices. In accordance with some embodiments, a p-channel transistor device configured as described herein may include a layer of TMDC material such as, for example, tungsten diselenide ($WSe_2$), tungsten disulfide ($WS_2$), molybdenum diselenide ($MoSe_2$), or molybdenum disulfide ($MoS_2$), and an n-channel transistor device configured as described herein may include a layer of III-V material such as, for example, gallium nitride (GaN), aluminum nitride (AlN), aluminum gallium nitride (AlGaN), and indium aluminum nitride (InAlN).

In general, TMDCs are two-dimensional materials that are strongly bound in plane, but very weakly bound in the third dimension. TMDCs have an appreciable bandgap and can be formed as individual sheets (e.g., monolayers) and thus may be utilized as a transistor channel material. TMDCs are typically hexagonal in crystal geometry, and thus their lattice structure and constants are similar to those of gallium nitride (GaN) and aluminum nitride (AlN), for example. As such, high-quality TMDC epitaxies can be formed over these and other similar III-N semiconductor materials. If an underlying III-N semiconductor layer is of sufficiently high bandgap, then an effective TMDC-on-insulator structure may be provided.

In accordance with some embodiments, use of the disclosed techniques may be detected, for example, by transmission electron microscopy (TEM) or other visual inspection of a given integrated circuit having a transistor device including one or more TMDC materials epitaxially grown on GaN-based or other III-N or III-V semiconductor-based materials configured as described herein.

Methodology and Structure

Figure 2:
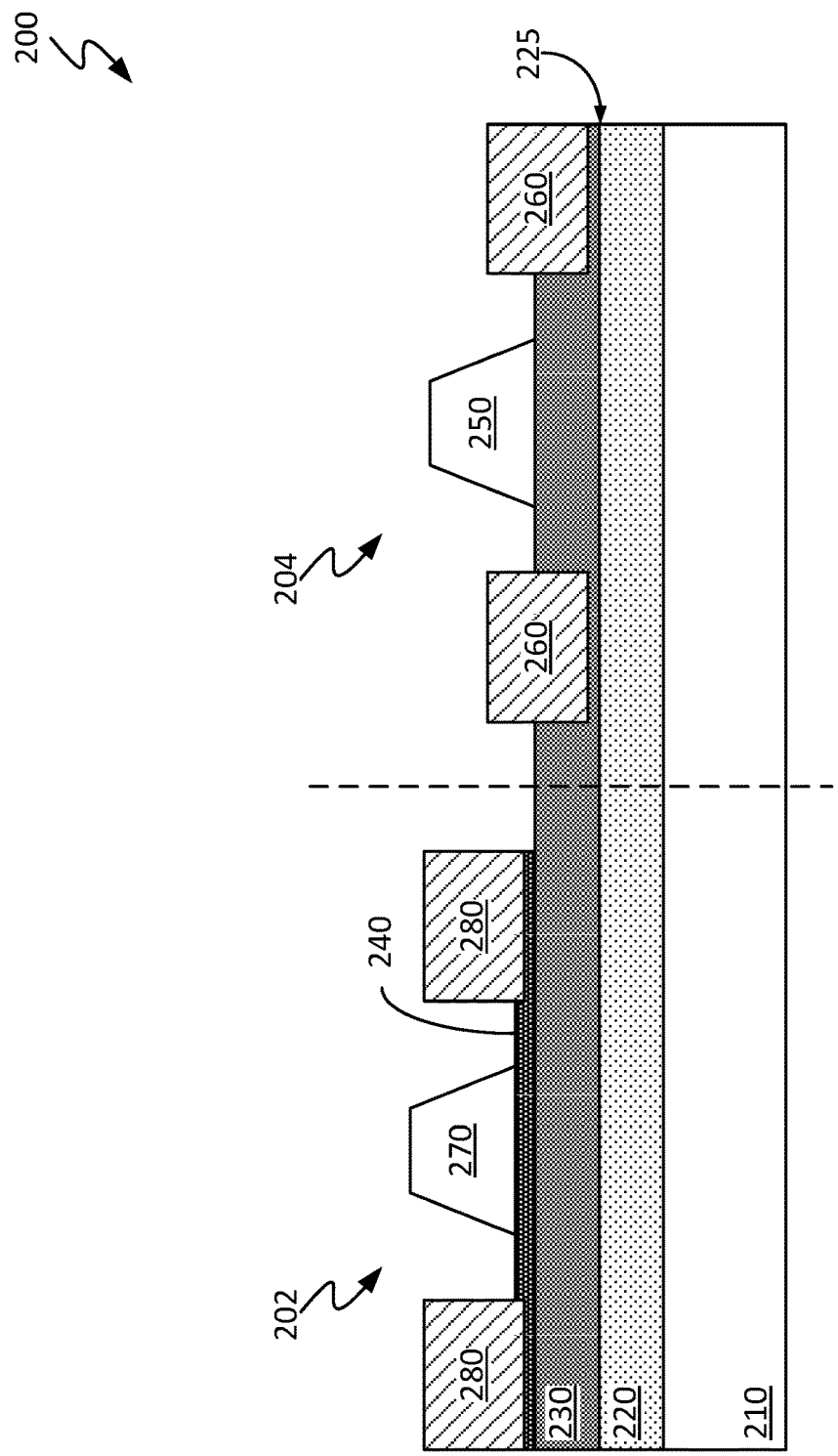
FIG. 2 is a side cross-sectional view of an IC formed via the process of FIG. 1, in accordance with an embodiment of the present disclosure.

FIG. 1 is a flow diagram of a process 100 of fabricating an integrated circuit (IC), in accordance with an embodiment of the present disclosure. FIG. 2 is a side cross-sectional view of an integrated circuit (IC) 200 formed via the process 100 of FIG. 1, in accordance with an embodiment of the present disclosure.

The process 100 may begin as in block 102 with providing a semiconductor substrate 210. Semiconductor substrate 210 may have any of a wide range of configurations. For instance, in some embodiments, semiconductor substrate 210 may be a bulk semiconductor substrate, a semiconductor-on-insulator (XOI, where X represents a semiconductor material), a semiconductor wafer of any standard, custom, or other desired size (e.g., a standard 300 mm wafer), or a multi-layered structure. The material composition of semiconductor substrate 210 may be customized, as desired for a given target application or end-use. For instance, in some cases, semiconductor substrate 210 may be formed from any one, or combination, of silicon (Si), germanium (Ge), and silicon-germanium (SiGe), among others. In an example case, semiconductor substrate 210 may be formed, at least in part, from Si having a crystal orientation of <111>, hereinafter referred to as Si(111). Other suitable materials, crystallographic orientations, and configurations for semiconductor substrate 210 will depend on a given application and will be apparent in light of this disclosure.

The process 100 may continue as in block 104 with forming one or more III-N semiconductor layers 220 over semiconductor substrate 210. The material composition of a given III-N semiconductor layer 220 may be customized, as desired for a given target application or end-use. For instance, in some cases, a given III-N semiconductor layer 220 may be formed from gallium nitride (GaN). A given III-N semiconductor layer 220 can be formed by any one, or combination, of suitable standard, custom, or proprietary technique(s), as will be apparent in light of this disclosure. Also, the thickness of a given III-N semiconductor layer 220 can be customized, as desired for a given target application or end-use. Other suitable materials, formation techniques, and dimensions for a given III-N semiconductor layer 220 (e.g., a given GaN device stack) will depend on a given application and will be apparent in light of this disclosure.

The process 100 may continue as in block 106 with forming one or more III-N semiconductor layers 230 over the one or more III-N semiconductor layers 220. The material composition of a given III-N semiconductor layer 230 may be customized, as desired for a given target application or end-use. For instance, in some cases, a given III-N semiconductor layer 230 may be formed from any one, or combination, of aluminum nitride (AlN), aluminum gallium nitride (AlGaN), and indium aluminum nitride (InAlN). A given III-N semiconductor layer 230 can be formed by any of the example techniques discussed above, for instance, with respect to first III-N semiconductor layers 220. Also, the thickness of a given III-N semiconductor layer 230 can be customized, as desired for a given target application or end-use. In some instances, a given III-N semiconductor layer 230 may be configured to serve, at least in part, as a polarization layer. Other suitable materials, formation techniques, and dimensions for a given III-N semiconductor layer 230 (e.g., a given AlN device stack) will depend on a given application and will be apparent in light of this disclosure.

As will be appreciated in light of this disclosure, during operation of IC 200, a two-dimensional electron gas (2DEG) 225 may exist, for example, at the interface between the one or more III-N semiconductor layers 230 and the one or more III-N semiconductor layers 220. As will be further appreciated in light of this disclosure, in some instances, 2DEG 225 may be, in a general sense, a gas of electrons that is free to move in two dimensions but tightly confined in a third dimension.

The process 100 may continue as in block 108 with forming a TMDC layer 240 over at least a portion of the one or more III-N semiconductor layers 230. The material composition of TMDC layer 240 may be customized, as desired for a given target application or end-use. For instance, in some cases, TMDC layer 240 may be formed from any one, or combination, of tungsten diselenide ($WSe_2$), tungsten disulfide ($WS_2$), molybdenum diselenide ($MoSe_2$), and molybdenum disulfide ($MoS_2$). In a more general sense, and in accordance with some embodiments, TMDC layer 240 may be formed from any suitable compound including a transition metal and a chalcogen, as desired for a given target application or end-use. In some instances, TMDC layer 240 may be formed from a material having a hole mobility of about 350 $cm^2/V \cdot s$ or greater, such as p-$WSe_2$, to facilitate high performance. In some cases, the material composition of TMDC layer 240 may be selected, at least in part, so as to be as nearly lattice-matched as possible with a given underlying III-N semiconductor layer 230.

TMDC layer 240 can be formed using any suitable standard, custom, or proprietary technique(s), as will be apparent in light of this disclosure. For instance, in some cases, TMDC layer 240 can be formed using any one, or combination, of a physical vapor deposition (PVD) process, a chemical vapor deposition (CVD) process such as a metal-organic CVD (MOCVD) process, and an epitaxial process such as a Van der Waals epitaxy (VDWE) process. In an example case, TMDC layer 240 may be formed using a CVD process in which a transition metal is initially formed over a given underlying III-N semiconductor layer 230, and a chalcogen is subsequently flowed there over, resulting in a TMDC layer 240 of a given desired transition metal and dichalcogenide chemical composition. In a general sense, such a transition metal is converted to the target TMDC material.

In accordance with some embodiments, TMDC layer 240 may be selectively formed over a given III-N semiconductor layer 230; for instance, area(s) over the one or more III-N semiconductor layers 230 where TMDC layer 240 is not desired may be masked off to prevent (or otherwise minimize) formation of TMDC layer 240 thereat. Masked off portion(s) thereafter may be unmasked, leaving behind the TMDC layer 240 formed over a given III-N semiconductor layer 230, as desired. In accordance with some other embodiments, TMDC layer 240 may be formed over III-N semiconductor layers 230 by a lithographic patterning process; for instance, a blanket layer of TMDC material may be deposited, portion(s) thereof may be masked off, and etching may be performed to remove TMDC material where TMDC layer 240 is not desired. Masked off portion(s) thereafter may be unmasked, leaving behind the TMDC layer 240 formed over a given III-N semiconductor layer 230, as desired.

The process 100 may continue as in block 110 with protecting the resultant TMDC layer 240 and forming n-channel transistor device 204 (e.g., a GaN n-channel transistor device). To protect TMDC layer 240, any suitable masking material may be used, as will be apparent in light of this disclosure. For instance, the mask may include any one, or combination, of silicon nitride ($Si_3N_4$), silicon dioxide ($SiO_2$), and a photoresist material. As will be appreciated in light of this disclosure, it may be desirable to ensure that the material of the mask is compatible with the temperature stability of other constituent materials of IC 200, as well as chemically non-reactive (e.g., minimally or otherwise only negligibly chemically reactive) with the underlying TMDC layer 240.

After protecting TMDC layer 240, a gate stack 250 may be formed over III-N semiconductor layers 230. Gate stack 250 may include a gate and a gate dielectric layer (e.g., disposed between the gate and an underlying layer). The gate and gate dielectric layer may be formed from any suitable gate and gate dielectric material(s), respectively, by any suitable standard, custom, or proprietary technique(s), as will be apparent in light of this disclosure. Also, the dimensions of gate stack 250 can be customized, as desired for a given target application or end-use. In some instances, the gate of gate stack 250 initially may serve as a dummy gate structure that is subsequently replaced with a given gate structure desired for a given target application or end-use.

After forming gate stack 250, openings may be formed within III-N semiconductor layers 230 and n-type source/drain contacts 260 may be formed within those openings, over III-N semiconductor layers 220. As can be seen from FIG. 2, for example, in some embodiments, contacts 260 may be formed so as to extend through at least a partial thickness of III-N semiconductor layers 230, over III-N semiconductor layers 220 (e.g., terminating within III-N semiconductor layers 230 over, but not on, III-N semiconductor layers 220). Contacts 260 may be formed from any suitable electrically conductive material(s) using any suitable standard, custom, or proprietary technique(s), as will be apparent in light of this disclosure. Also, the dimensions of contacts 260 can be customized, as desired for a given target application or end-use. Other suitable materials, dimensions, and configurations for contacts 260 will depend on a given application and will be apparent in light of this disclosure.

The process 100 may continue as in block 112 with protecting the resultant n-channel transistor device 204 and forming the remainder of p-channel transistor device 202 (e.g., which will include the TMDC layer 240). To protect n-channel transistor device 204, any suitable masking material may be used, such as any of those example materials discussed above, for instance, with respect to the masking of TMDC layer 240. After protecting n-channel transistor device 204, a gate stack 270 may be formed over TMDC layer 240. As with gate stack 250 discussed above, gate stack 270 may include a gate and a gate dielectric layer (e.g., disposed between the gate and an underlying layer), which may be formed from any suitable gate and gate dielectric material(s), respectively, by any suitable standard, custom, or proprietary technique(s), as will be apparent in light of this disclosure. Also, the dimensions of gate stack 270 can be customized, as desired for a given target application or end-use. After forming gate stack 270, p-type source/drain contacts 280 may be formed over (e.g., within or otherwise on) TMDC layer 240, over III-N semiconductor layers 230, in accordance with some embodiments. In accordance with some other embodiments, contacts 280 may be formed adjacent to TMDC layer 240, over III-N semiconductor layers 230. In a more general sense, the placement of contacts 280 may be customized, as desired for a given target application or end-use, and in some cases may be chosen, at least in part, based on a given desired electronic contacting scheme efficiency for IC 200 (or other IC provided, in part or in whole, via the process flow of FIG. 1). As will be appreciated in light of this disclosure, in some instances, contacting TMDC layer 240 from the top as opposed to at its ends may be more efficient electrically given the larger overlap area available at the interface of contacts 280 and an upper surface of TMDC layer 240, as compared to at the interface of contacts 280 and a sidewall surface of TMDC layer 240. As with contacts 260 discussed above, contacts 280 may be formed from any suitable electrically conductive material(s) using any suitable standard, custom, or proprietary technique(s), as will be apparent in light of this disclosure. Also, the dimensions of contacts 280 can be customized, as desired for a given target application or end-use. Other suitable materials, dimensions, and configurations for contacts 280 will depend on a given application and will be apparent in light of this disclosure.

The process 100 may continue as in block 114 with interconnecting p-channel transistor device 202 and n-channel transistor device 204 as desired for a given target application or end-use. For instance, in some cases, devices 202 and 204 may be interconnected as desired to provide a PMIC. In some other cases, devices 202 and 204 may be interconnected as desired to provide an RF PA. In an example case, a plurality of n-channel transistor devices 204 may be interconnected, and one or more p-channel transistor device 202 may be connected therewith. In some instances, devices 202 and 204 may be interconnected to provide co-integration of p-channel TMDC transistor devices with GaN-based n-channel transistor devices for logic and controllers in PMIC and RF PA. Other suitable interconnections and resultant device configurations will depend on a given application and will be apparent in light of this disclosure.

Example System

Figure 3:
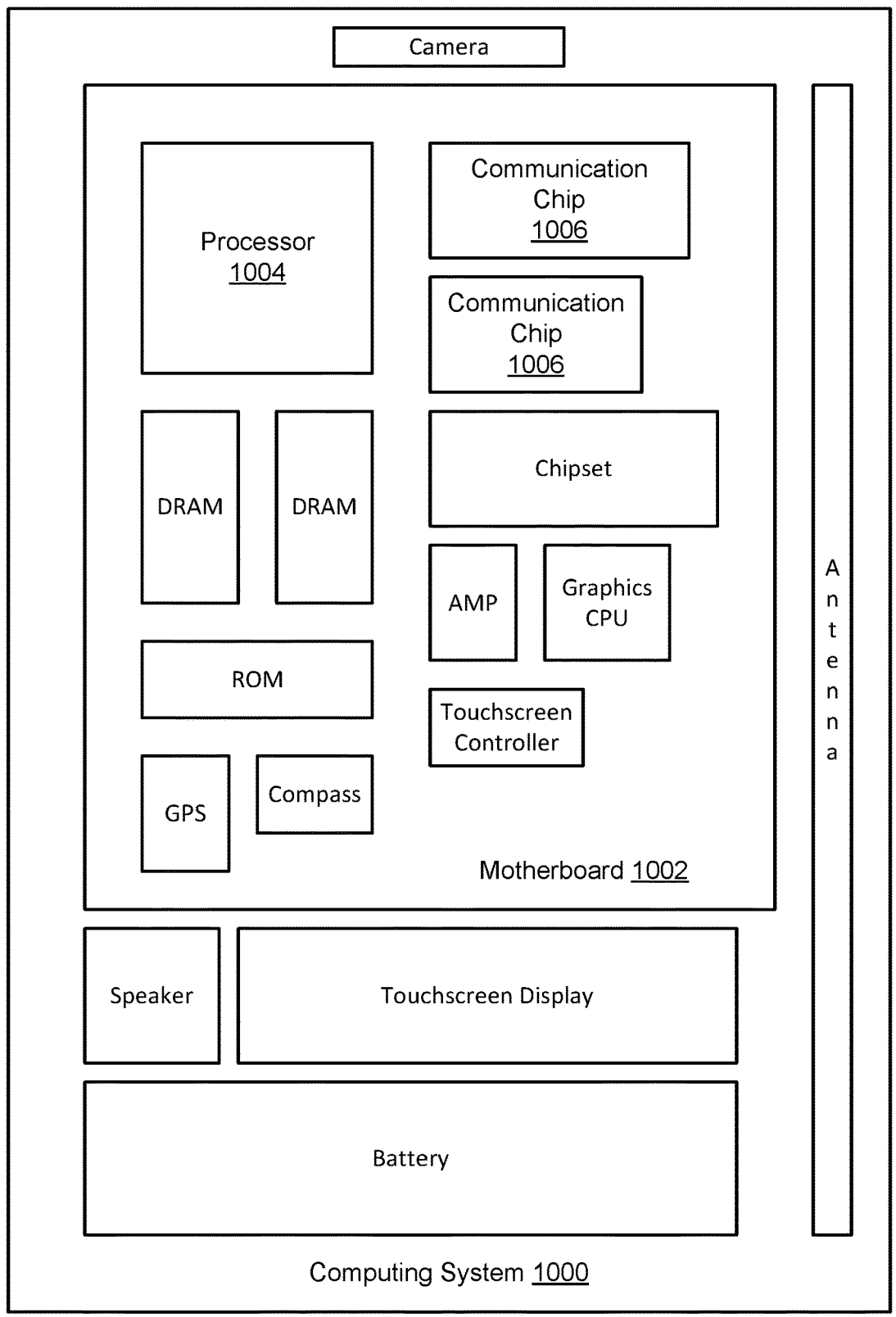
FIG. 3 illustrates a computing system implemented with IC structures or devices formed using the disclosed techniques in accordance with an example embodiment.

FIG. 3 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit including: a semiconductor substrate; a first III-N semiconductor layer disposed over the semiconductor substrate; a second III-N semiconductor layer disposed over the first III-N semiconductor layer, the second III-N semiconductor layer of different material composition than the first III-N semiconductor layer; a transition metal dichalcogenide (TMDC) layer disposed over a first portion of the second III-N semiconductor layer and not disposed over a second portion of the second III-N semiconductor layer; a first gate disposed over the TMDC layer; and a second gate disposed over the second portion of the second III-N semiconductor layer.

Example 2 includes the subject matter of any of Examples 1 and 3-15, wherein the TMDC layer includes tungsten diselenide ($WSe_2$).

Example 3 includes the subject matter of any of Examples 1-2 and 4-15, wherein the TMDC layer includes at least one of tungsten disulfide ($WS_2$), molybdenum diselenide ($MoSe_2$), and molybdenum disulfide ($MoS_2$).

Example 4 includes the subject matter of any of Examples 1-3 and 5-15, wherein the TMDC layer includes a material having a hole mobility of about 350 $cm^2/V·s$ or greater.

Example 5 includes the subject matter of any of Examples 1-4 and 6-15 and further includes: source/drain contacts disposed either over or adjacent to the TMDC layer, over the second III-N semiconductor layer; and source/drain contacts disposed within the second III-N semiconductor layer, over the first III-N semiconductor layer.

Example 6 includes the subject matter of any of Examples 1-5 and 7-15, wherein the semiconductor substrate includes at least one of silicon (Si), germanium (Ge), and silicon-germanium (SiGe).

Example 7 includes the subject matter of any of Examples 1-6 and 8-15, wherein the semiconductor substrate includes silicon (Si) having a crystal orientation of <111>.

Example 8 includes the subject matter of any of Examples 1-7 and 9-15, wherein the semiconductor substrate is configured as a bulk semiconductor substrate.

Example 9 includes the subject matter of any of Examples 1-8 and 10-15, wherein the semiconductor substrate is configured as a semiconductor wafer.

Example 10 includes the subject matter of any of Examples 1-9 and 11-15, wherein the first III-N semiconductor layer includes gallium nitride (GaN).

Example 11 includes the subject matter of any of Examples 1-10 and 12-15, wherein the second III-N semiconductor layer includes at least one of aluminum nitride (AlN), aluminum gallium nitride (AlGaN), and indium aluminum nitride (InAlN).

Example 12 includes the subject matter of any of Examples 1-11 and 13-15, wherein the first III-N semiconductor layer and the second III-N semiconductor layer interface such that a two-dimensional electron gas (2DEG) exists at the interface.

Example 13 is a power management integrated circuit (PMIC) including an integrated circuit including the subject matter of any of Examples 1-12 and 14-15.

Example 14 is a radio frequency (RF) power amplifier including an integrated circuit including the subject matter of any of Examples 1-13 and 15.

Example 15 is a voltage regulator (VR) power train including an integrated circuit including the subject matter of any of Examples 1-14.

Example 16 is a method of fabricating an integrated circuit, the method including: forming a first III-N semiconductor layer over a semiconductor substrate; forming a second III-N semiconductor layer over the first III-N semiconductor layer, the second III-N semiconductor layer of different material composition than the first III-N semiconductor layer; forming a transition metal dichalcogenide (TMDC) layer over a first portion of the second III-N semiconductor layer but not over a second portion of the second III-N semiconductor layer; forming a first gate over the second portion of the second III-N semiconductor layer; forming source/drain contacts within the second III-N semiconductor layer, over the first III-N semiconductor layer; forming a second gate over the TMDC layer; and forming source/drain contacts either over or adjacent to the TMDC layer, over the second III-N semiconductor layer.

Example 17 includes the subject matter of any of Examples 16 and 19-33, wherein forming the TMDC layer includes: masking off the second portion of the second III-N semiconductor layer such that the TMDC layer will not form there over; selectively forming the TMDC layer over the first portion of the second III-N semiconductor layer; and unmasking the second portion of the second III-N semiconductor layer.

Example 18 includes the subject matter of any of Examples 16 and 19-33, wherein forming the TMDC layer includes: forming a blanket TMDC layer over the second III-N semiconductor layer; masking off a first portion of the blanket TMDC layer over the first portion of the second III-N semiconductor layer; removing a second portion of the blanket TMDC layer from over the second portion of the second III-N semiconductor layer; and unmasking the first portion of the blanket TMDC layer over the first portion of the second III-N semiconductor layer.

Example 19 includes the subject matter of any of Examples 16-18 and 20-33, wherein forming the TMDC layer includes at least one of a physical vapor deposition (PVD) process, a metal-organic chemical vapor deposition (MOCVD) process, and a Van der Waals epitaxy (VDWE) process.

Example 20 includes the subject matter of any of Examples 16-19 and 21-33, wherein forming the TMDC layer includes: flowing a chalcogen over a transition metal layer to produce the TMDC layer.

Example 21 includes the subject matter of Example 20, wherein: the chalcogen includes selenium (Se); and the transition metal layer includes tungsten (W).

Example 22 includes the subject matter of any of Examples 16-21 and 23-33, wherein the TMDC layer includes tungsten diselenide ($WSe_2$).

Example 23 includes the subject matter of any of Examples 16-22 and 24-33, wherein the TMDC layer includes at least one of tungsten disulfide ($WS_2$), molybdenum diselenide ($MoSe_2$), and molybdenum disulfide ($MoS_2$).

Example 24 includes the subject matter of any of Examples 16-23 and 25-33, wherein the semiconductor substrate includes at least one of silicon (Si), germanium (Ge), and silicon-germanium (SiGe).

Example 25 includes the subject matter of any of Examples 16-24 and 26-33, wherein the semiconductor substrate includes silicon (Si) having a crystal orientation of <111>.

Example 26 includes the subject matter of any of Examples 16-25 and 27-33, wherein the semiconductor substrate is configured as a bulk semiconductor substrate.

Example 27 includes the subject matter of any of Examples 16-26 and 28-33, wherein the semiconductor substrate is configured as a semiconductor wafer.

Example 28 includes the subject matter of any of Examples 16-27 and 29-33, wherein the first III-N semiconductor layer includes gallium nitride (GaN).

Example 29 includes the subject matter of any of Examples 16-28 and 30-33, wherein the second III-N semiconductor layer includes at least one of aluminum nitride (AlN), aluminum gallium nitride (AlGaN), and indium aluminum nitride (InAlN).

Example 30 includes the subject matter of any of Examples 16-29 and 31-33, wherein the first III-N semiconductor layer and the second III-N semiconductor layer interface such that a two-dimensional electron gas (2DEG) exists at the interface.

Example 31 includes the subject matter of any of Examples 16-30 and 32-33 and further includes: forming one or more electrical interconnections for the integrated circuit to provide a power management integrated circuit (PMIC).

Example 32 includes the subject matter of any of Examples 16-31 and 33 and further includes: forming one or more electrical interconnections for the integrated circuit to provide a radio frequency (RF) power amplifier.

Example 33 includes the subject matter of any of Examples 16-32 and further includes: forming one or more electrical interconnections for the integrated circuit to provide a voltage regulator (VR) power train.

Example 34 is an integrated circuit including: a silicon (Si) substrate; a first transistor device disposed over the Si substrate and including: a gallium nitride (GaN) layer disposed over the Si substrate; at least one of an aluminum nitride (AlN), aluminum gallium nitride (AlGaN), and indium aluminum nitride (InAlN) layer disposed over the GaN layer; a transition metal dichalcogenide (TMDC) layer disposed over the at least one of an AlN, AlGaN, and InAlN layer; a metal gate disposed over the TMDC layer; and p-type source/drain contacts disposed either over or adjacent to the TMDC layer, over the at least one of an AlN, AlGaN, and InAlN layer; a second transistor device disposed over the Si substrate and including: a GaN layer disposed over the Si substrate; at least one of an AlN, AlGaN, and InAlN layer disposed over the GaN layer; a metal gate disposed over the at least one of an AlN, AlGaN, and InAlN layer; and n-type source/drain contacts disposed within the at least one of an AlN, AlGaN, and InAlN layer, over the GaN layer.

Example 35 includes the subject matter of any of Examples 34 and 36-40, wherein the TMDC layer includes at least one of tungsten diselenide ($WSe_2$), tungsten disulfide ($WS_2$), molybdenum diselenide ($MoSe_2$), and molybdenum disulfide ($MoS_2$).

Example 36 includes the subject matter of any of Examples 34-35 and 37-40, wherein the GaN layer of the first transistor device and the GaN layer of the second transistor device together constitute a single, unitary layer.

Example 37 includes the subject matter of any of Examples 34-36 and 38-40, wherein the at least one of an AlN, AlGaN, and InAlN layer of the first transistor device and the at least one of an AlN, AlGaN, and InAlN layer of the second transistor device together constitute a single, unitary layer.

Example 38 includes the subject matter of any of Examples 34-37 and 39-40, wherein the Si substrate has a <111> crystal orientation.

Example 39 includes the subject matter of any of Examples 34-38, wherein the Si substrate is configured as a bulk Si substrate.

Example 40 includes the subject matter of any of Examples 34-38, wherein the Si substrate is configured as a Si wafer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a semiconductor substrate;
   a first III-N semiconductor layer disposed over the semiconductor substrate;
   a second III-N semiconductor layer disposed over the first III-N semiconductor layer, the second III-N semiconductor layer of different material composition than the first III-N semiconductor layer;
   a transition metal dichalcogenide (TMDC) layer disposed over a first portion of the second III-N semiconductor layer and not disposed over a second portion of the second III-N semiconductor layer;
   a first gate disposed over the TMDC layer; and
   a second gate disposed over the second portion of the second III-N semiconductor layer.

2. The integrated circuit of claim 1, wherein the TMDC layer comprises tungsten and selenium.

3. The integrated circuit of claim 1, wherein the TMDC layer comprises tungsten and sulfur, or molybdenum and selenium, or molybdenum and sulfur, or any combination of tungsten and sulfur, molybdenum and selenium, and/or molybdenum and sulfur.

4. The integrated circuit of claim 1 further comprising:
   source/drain contacts disposed either over or adjacent to the TMDC layer, over the second III-N semiconductor layer; and
   source/drain contacts disposed within the second III-N semiconductor layer, over the first III-N semiconductor layer.

5. The integrated circuit of claim 1, wherein the semiconductor substrate comprises at least one of silicon (Si), germanium (Ge), and silicon-germanium (SiGe).

6. The integrated circuit of claim 1, wherein the semiconductor substrate comprises silicon (Si) having a crystal orientation of <111>.

7. The integrated circuit of claim 1, wherein:
   the first III-N semiconductor layer comprises gallium and nitrogen; and
   the second III-N semiconductor layer comprises aluminum and nitrogen, or aluminum gallium and nitrogen, or indium aluminum and nitrogen, or some combination of aluminum and nitrogen, aluminum gallium and nitrogen, and/or indium aluminum nitrogen.

8. The integrated circuit of claim 1, wherein the integrated circuit is part of a power management integrated circuit (PMIC).

9. The integrated circuit of claim 1, wherein the integrated circuit is part of a radio frequency (RF) power amplifier.

10. The integrated circuit of claim 1, wherein the integrated circuit is part of a voltage regulator (VR) power train.

11. A method of fabricating an integrated circuit, the method comprising:
    forming a first III-N semiconductor layer over a semiconductor substrate;
    forming a second III-N semiconductor layer over the first III-N semiconductor layer, the second III-N semiconductor layer of different material composition than the first III-N semiconductor layer;
    forming a transition metal dichalcogenide (TMDC) layer over a first portion of the second III-N semiconductor layer but not over a second portion of the second III-N semiconductor layer;
    forming a first gate over the second portion of the second III-N semiconductor layer;
    forming source/drain contacts within the second III-N semiconductor layer, over the first III-N semiconductor layer;
    forming a second gate over the TMDC layer; and
    forming source/drain contacts either over or adjacent to the TMDC layer, over the second III-N semiconductor layer.

12. The method of claim 11, wherein forming the TMDC layer comprises:
    masking off the second portion of the second III-N semiconductor layer such that the TMDC layer will not form there over;
    selectively forming the TMDC layer over the first portion of the second III-N semiconductor layer; and
    unmasking the second portion of the second III-N semiconductor layer.

13. The method of claim 11, wherein forming the TMDC layer comprises:
    forming a blanket TMDC layer over the second III-N semiconductor layer;
    masking off a first portion of the blanket TMDC layer over the first portion of the second III-N semiconductor layer;
    removing a second portion of the blanket TMDC layer from over the second portion of the second III-N semiconductor layer; and
    unmasking the first portion of the blanket TMDC layer over the first portion of the second III-N semiconductor layer.

14. The method of claim 11, wherein forming the TMDC layer comprises at least one of a physical vapor deposition (PVD) process, a metal-organic chemical vapor deposition (MOCVD) process, and a Van der Waals epitaxy (VDWE) process.

15. The method of claim 11, wherein forming the TMDC layer comprises:
    flowing a chalcogen over a transition metal layer to produce the TMDC layer.

16. The method of claim 11 further comprising:
    forming one or more electrical interconnections for the integrated circuit to provide at least one of a power management integrated circuit (PMIC), a radio frequency (RF) power amplifier, and a voltage regulator (VR) power train.

17. An integrated circuit comprising:
    a silicon (Si) substrate;
    a first transistor device disposed over the Si substrate and comprising:
        a gallium nitride (GaN) layer disposed over the Si substrate;
        at least one of an aluminum nitride (AlN), aluminum gallium nitride (AlGaN), and indium aluminum nitride (InAlN) layer disposed over the GaN layer;
        a transition metal dichalcogenide (TMDC) layer disposed over the at least one of an AlN, AlGaN, and InAlN layer;
        a metal gate disposed over the TMDC layer; and
        p-type source/drain contacts disposed either over or adjacent to the TMDC layer, over the at least one of an AlN, AlGaN, and InAlN layer;
    a second transistor device disposed over the Si substrate and comprising:
        a GaN layer disposed over the Si substrate;
        at least one of an AlN, AlGaN, and InAlN layer disposed over the GaN layer;
        a metal gate disposed over the at least one of an AlN, AlGaN, and InAlN layer; and n-type source/drain contacts disposed within the at least one of an AlN, AlGaN, and InAlN layer, over the GaN layer.

18. The integrated circuit of claim 17, wherein the TMDC layer comprises at least one of tungsten diselenide ($WSe_2$), tungsten disulfide ($WS_2$), molybdenum diselenide ($MoSe_2$), and molybdenum disulfide ($MoS_2$).

19. The integrated circuit of claim 17, wherein at least one of:
the GaN layer of the first transistor device and the GaN layer of the second transistor device together constitute a single, unitary layer; and
the at least one of an AlN, AlGaN, and InAlN layer of the first transistor device and the at least one of an AlN, AlGaN, and InAlN layer of the second transistor device together constitute a single, unitary layer.

20. The integrated circuit of claim 17, wherein the Si substrate is configured as a bulk Si substrate or a Si wafer.

* * * * *